(12) United States Patent
Schafer et al.

(10) Patent No.: US 8,392,130 B2
(45) Date of Patent: Mar. 5, 2013

(54) HIGH VOLTAGE POWER LINE COMMUNICATION SYSTEM USING AN ENERGY HARVESTING POWER SUPPLY

(75) Inventors: Bradley John Schafer, Fayetteville, GA (US); Joseph Richard Rostron, McDonough, GA (US); Russell Keith Ortkiese, Hampton, GA (US); Raj Anand, McDonough, GA (US)

(73) Assignee: SSI Power, LLC, Hampton, GA (US)

( * ) Notice: Subject to any disclaimer, the term of this patent is extended or adjusted under 35 U.S.C. 154(b) by 420 days.

(21) Appl. No.: 12/756,248

(22) Filed: Apr. 8, 2010

(65) Prior Publication Data

US 2010/0280775 A1 Nov. 4, 2010

Related U.S. Application Data

(60) Provisional application No. 61/173,707, filed on Apr. 29, 2009.

(51) Int. Cl.
*G01R 19/00* (2006.01)
(52) U.S. Cl. .......................................................... 702/62
(58) Field of Classification Search .................... 702/62, 702/64, 76, 77, 182–185
See application file for complete search history.

(56) References Cited

U.S. PATENT DOCUMENTS

| | | | |
|---|---|---|---|
| 5,565,783 | A | 10/1996 | Lau et al. |
| 5,892,430 | A | 4/1999 | Wiesman et al. |
| 2006/0176631 | A1* | 8/2006 | Cannon ........................... 361/80 |

FOREIGN PATENT DOCUMENTS

WO WO 93/12436 A1 6/1993

* cited by examiner

*Primary Examiner* — Edward Raymond
(74) *Attorney, Agent, or Firm* — Michael J. Mehrman; Mehrman Law Office, P.C.

(57) ABSTRACT

A communication and control system for a high voltage power line using an energy harvesting power supply to avoid batteries in the communication components maintained at line voltage. The energy harvesting power supply utilizes scavenged backscatter power received from a transceiver maintained at ground potential or a power supply with a super-saturating magnetic flux core, such as a mu-metal core, to harvest electromagnetic field energy from the power line. The communication equipment maintained at line voltage communicates information to the transceiver maintained at ground potential by modulating backscatter energy reflected from the beam transmitted by the ground level transceiver to minimize the power requirement of the communication equipment maintained at line voltage. Response equipment includes capacitors, voltage regulator, voltage sag supporter, circuit interrupter, remote communication equipment, reporting and analysis system.

20 Claims, 2 Drawing Sheets

HIGH VOLTAGE POWER LINE COMMUNICATION SYSTEM USING AN ENERGY HARVESTING POWER SUPPLY

REFERENCE TO RELATED APPLICATION

This application claims filing priority to U.S. Provisional Patent Application Ser. No. 61/173,707 filed Apr. 29, 2009, which is incorporated herein by reference.

TECHNICAL FIELD

The invention relates to electric power systems and, more particularly, to a communication system for a high voltage power line that employs an energy harvesting power supply to avoid the need for batteries in the communication components maintained at line voltage, which allows this equipment to operate continuously without the need for periodic battery replacement.

BACKGROUND OF THE INVENTION

Power line monitoring systems with communication components maintained at line voltage using modulated backscatter have been developed. However, these systems report only abnormal line conditions, such as faults or overload, or voltage sag conditions. In addition, the communication components maintained at line voltage are battery powered and located near the power lines, typically at high elevations on the power line towers or poles. Because changing the batteries is inconvenient and costly, these devices are configured to report only periodically or in response to abnormal line conditions in order to save battery power. Although more frequent or continuous reporting could be advantageous, the need to save battery power generally prevents conventional communication components maintained at line voltage from reporting more frequently or continuously.

SUMMARY OF THE INVENTION

The present invention meets the needs described above in a communication and control system for a high voltage power line that uses an energy harvesting power supply to avoid the need for batteries in the communication components maintained at line voltage. In a first alternative, the energy harvesting power supply utilizes scavenged backscatter power received from a transceiver maintained at ground potential. In a second alternative, the energy harvesting power supply utilizes a super-saturating magnetic flux core, such as a mu-metal core, to harvest electromagnetic field energy emitted by the power line. In addition, the communication equipment maintained at line voltage communicates information to the transceiver maintained at ground potential by modulating backscatter energy reflected from the beam transmitted by the transceiver to minimize the power requirement of the communication equipment maintained at line voltage. The transceiver maintained at ground potential also typically receives its power from the monitored power line, for example from a local transformer connected to the power line or from a lower voltage circuit interconnected with the associated power line through a nearby substation. The combination of these techniques allows the communication system to continuously monitor and report operating parameters concerning the power line whenever the power line is energized without the need for periodically replacing batteries.

The communication and control system can be used to report measured operating parameters concerning the power line, such as current, voltage, temperature, line physical sag, and power factor to a remote control center, typically through a SCADA communication system. The power line control equipment may be operated by the remote control center, which also typically receives the measured operating parameters into an analysis and reporting system that determines the appropriate power line control equipment to operate in response to the measured operating parameters. The communication and control system can also be used to automatically operate the local power line control equipment in response to the monitored power line data. For example, the local communication and control system or the remote control center can operate a capacitor bank in response to a low power factor condition, operate a voltage regulator in response to high voltage condition, operate a voltage sag supporter in response to low voltage condition, operate a circuit interrupter in response to a fault condition, or operate load shedding switches or other suitable equipment in response to the monitored power line parameters transmitted by the power line communication system.

Generally described, the invention may be embodied as a communication and control system for a high voltage electric power line operating at a line voltage. The system includes a transceiver maintained at ground potential powered via the electric power line and communication equipment maintained at the line voltage. The line voltage equipment includes one or more low power transducers for obtaining measured parameters indicating operating conditions of the power line, a microcontroller for processing the measured parameters, an antenna for communicating the measured parameters to the transceiver maintained at ground, and a battery-free energy harvesting power supply providing electric power to electronic components of the communication equipment maintained at the line voltage. The system also includes response equipment coupled to the transceiver maintained at ground potential for implementing one or more response actions in response to the measured parameters. The transceiver maintained at ground potential and the communication equipment maintained at the line voltage both obtain operating power via the electric power line and operate continuously whenever the electric power line is energized under a loaded condition. While the communication equipment maintained at the line voltage utilizes energy harvesting, the transceiver maintained at ground potential is typically powered by a local transformer connected to the power line or from a lower voltage circuit interconnected with the associated power line through a nearby substation.

The energy harvesting power supply may obtain scavenged power transmitted by the transceiver maintained at ground potential. Alternatively, the energy harvesting power supply may obtain power from an electromagnetic field produced by the power line through a super-saturating magnetic flux core. In addition, the communication equipment maintained at the line voltage typically communicates the measured parameters to the transceiver maintained at ground potential by modulating a beam of energy transmitted by the transceiver maintained at ground potential and reflected back to the transceiver maintained at ground potential. For example, the communication equipment maintained at the line voltage may modulate the beam of energy transmitted by the transceiver maintained at ground potential by switching an element that changes an impedance characteristic of the antenna.

To further reduce the power requirement of the communication equipment maintained at line voltage, the communication equipment maintained at the line voltage communicates the measured parameters to the transceiver maintained at ground potential in a raw data format comprising data points obtained from each sensor at least every 4 milliseconds that has not been error corrected, integrated or summarized. The transceiver maintained at ground potential or a processor operatively connected to the transceiver maintained at ground potential error corrects, integrates and summarizes the measured parameters to reconstruct one or more wave forms represented by the measured parameters.

The response equipment usually includes one or more pieces of power control equipment, such as a capacitor bank, a voltage regulator, a voltage sag supporter, or a circuit interrupter. The response equipment may also include communication equipment for transmitting the measured parameters to a remote location that enters the measured parameters into a reporting and analysis system. In this case, the remote control center may remotely control power the control equipment affecting the operation of the power line.

DETAILED DESCRIPTION OF THE EMBODIMENTS

Figure 1:
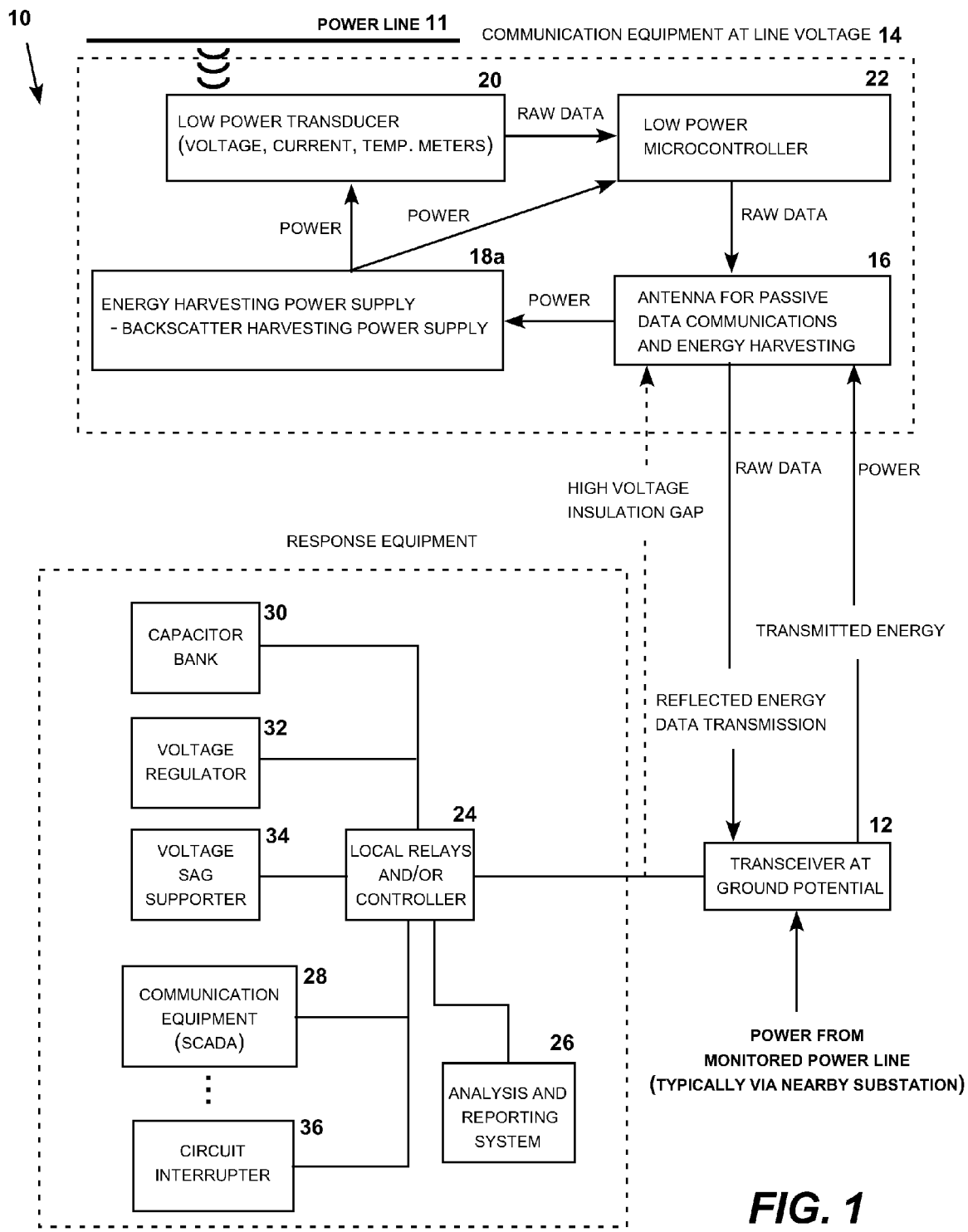
FIG. 1 is a functional block diagram of a high voltage power line communication and control system using a power harvesting power supply maintained at line voltage that scavenges energy transmitted by a ground level transceiver.

The present invention provides a significant improvement in communication and control systems for high voltage electric power lines by utilizing a power harvesting power supply maintained at line voltage to supply electric power to the electronics located in the communication equipment maintained at line voltage. As the equipment maintained at line voltage is physically located high above the ground on a transmission tower and at high voltage, physically accessing the equipment to change batteries is inconvenient and costly. The present invention solves this problem through use of a power harvesting power supply maintained at line voltage. As the power supply harvests power whenever the power line is energized, it provides electric power to operate the communication equipment whenever the power line is energized without using batteries. Accordingly, the term "energized" means that the power line is electrically connected to the power grid at its intended operating voltage creating at least a minimally loaded condition sufficient to cause the energy harvesting power supply to provide electric power to the communication electronics. The line voltage transceiver also minimizes its power requirement by modulating reflected power originating from the ground potential transceiver. This allows the communication system to operate continuously whenever the power line is energized without concern for depleting the batteries.

To further reduce the power requirement of the communication equipment maintained at line voltage, the monitored data obtained by the sensors may be digitized at the sensors and continuously streamed without summarizing, integrating, error correcting or otherwise processing the data. The real time sensor data streams continuously, which in practice means sending a minimum of 4 samples of waveform data per cycle, which results in data points at least every 4 ms for a typical power system operating at 50 or 60 Hertz. An illustrative system typically sends sensor data packets every millisecond but can be adjusted to be faster or slower, as desired. The "raw" sensor data is sent directly from the sensor at line potential to the base unit at ground potential, which error corrects, integrates and summarizes the sensor data to reconstruct the wave form. The fully reconstructed wave form is then analyzed for making intelligent decisions at the locally or remote control units.

All other line mounted power monitoring systems reconstruct the wave form for each sensor and provide summarized sensor data at line potential for each sensor separately and then send the summarized data on a periodic basis, such as once per minute. The present power monitoring system, with its low power needs at line potential, allows for continuous streaming of sensor data including multiple sample points of data per cycle. Each data point is sent separately and sequentially to the ground level, which eliminates the need for reconstructing the waved form and summarizing the sensor data at line potential. This allows more complex error correction and equipment protection algorithms to be implemented effectively at ground level by combining information from multiple sensors simultaneously, which is not possible in with other power monitoring system that produce summarized data from each sensor individually.

The power line communication and control system also includes response equipment coupled to the transceiver maintained at ground potential for implementing one or more response actions in response to the measured parameters. The response equipment may include local response equipment as well as remote response equipment interconnected with the local communication and control system via a suitable communication system, such as a SCADA system, dedicated data line, Internet link, telephone link, wireless data link, or other suitable communication system. The local response equipment typically includes one or more power control devices, such as a capacitor bank, voltage regulator, voltage sag supporter, or circuit interrupter. The remote response equipment typically includes a reporting and analysis system and may also be configured to remotely operate the power control devices that control the operation of the power line. The power control devices may be located where the communication equipment is located, for example at a substation, or at any other location in the power system. In general, a number of communication and control systems, all operating through power harvesting without the need for periodic battery replacement, can be used to monitor and control a power generation, transmission and distribution system-wide using a combination of locally and remotely controlled devices along with centralized reporting and analysis to greatly improve the knowledge, reliability and efficiency of the electric power system.

Turning now to the figures, FIG. 1 is a functional block diagram of the communication and control system 10 for monitoring and controlling an associated power line. A transceiver maintained at ground potential 12 is powered through the associated power line, typically via a local transformer connected to the power line or from a lower voltage circuit interconnected with the associated power line through a nearby substation. The transceiver maintained at ground potential 12 transmits a beam of energy through the ambient atmosphere to the communication equipment maintained at line voltage 14, which is physically mounted near the associated power line at a high elevation on the tower or pole supporting the power line. The communication equipment maintained at line voltage 14 includes an antenna 16 configured to engage in passive data communication and energy harvesting. The antenna 16 typically communicates data by modulating a resistor or other electric device connected to the antenna to vary the impedance of the antenna. This modulates the reflected energy, which is received as a reflected data signal by the transceiver maintained at ground potential 12. It should be appreciated that this data and power link occurs across a high-voltage insulation gap (ambient atmosphere) without a conductor electrically connecting the high voltage equipment 14 with the ground potential transceiver 12.

The communication equipment maintained at line voltage 14 also includes an energy harvesting power supply 18a that receives scavenged power from the antenna 16 and supplies appropriately conditioned and regulated harvested power to the other communication equipment including one or more low power transducers 20 and a low power microcontroller 22 that typically digitizes, buffers and supplies the measured parameters to the antenna 16 maintained at line voltage for communication to the transceiver 14 maintained at ground potential. The low power transducers 20 include power line monitoring equipment, such as voltage, current, and temperature meters and any other desired monitoring devices. The low power microcontroller 22 typically converts the monitored data received from the low power transducers 20 to produce voltage, current and power factor readings for the monitored power line. The microcontroller 22 also modulates the antenna to encode the voltage, current and power factor reading into the backscatter signal reflected from the antenna 16 to the transceiver maintained at ground potential 12. With this configuration, the communication system 10 continuously monitors the associated power line and reports the desired parameters, in this example voltage, current, temperature, and power factor readings for the power line, whenever the power line is energized without the need for batteries in the communication equipment maintained at line voltage 14 or in the ground potential transceiver 12.

The ground potential transceiver 12, in turn, can report the power line parameters to any desired location or control any desired equipment based on the measured power line parameters. For example, the transceiver 12 can communicate with and control local relays and/or a local controller 24. The local controller 24, in turn, can transmit the power line parameters to a local analysis and reporting system 26 and/or a remote control center through communication equipment (SCADA) 28. The local relays and/or local controller 24 can also operate local equipment to control the monitored power line. For example, the local relays and/or a local controller 24 can operate a capacitor bank 30 in response to a low power factor condition, operate a voltage regulator 32 in response to a high voltage condition, operate a voltage sag supporter 34 in response to low voltage condition, operate a circuit interrupter 36 in response to a fault condition, or operate load shedding switches or other suitable equipment in response to the power line parameters.

To avoid interference, the communication link implemented by the ground potential transceiver 12 preferably operates above 2.4 GHz. It has been found that a communication link operation at 5.8 GHz encounters significantly less interference that a communication link operation at 2.4 GHz. The communication and control system described above has the additional advantages of reporting power line parameters continuously in real time whenever the power line is energized without the need for battery powered components. For this reason, the system is not limited to reporting faults or other abnormal power line conditions. It should also be understood that the communication equipment maintained at line voltage 14 may be deployed in a single enclosure with an attached antenna. The equipment may also include leads extending from the enclosure to current transformers, which are typically located very close to the phase conductors. Alternatively, the equipment may be deployed in separate enclosures as a matter of design choice. In practice, the monitored data should be digitized as close to the source meters as practical to avoid transmitting analog data over data links that can pick up interference.

Figure 2:
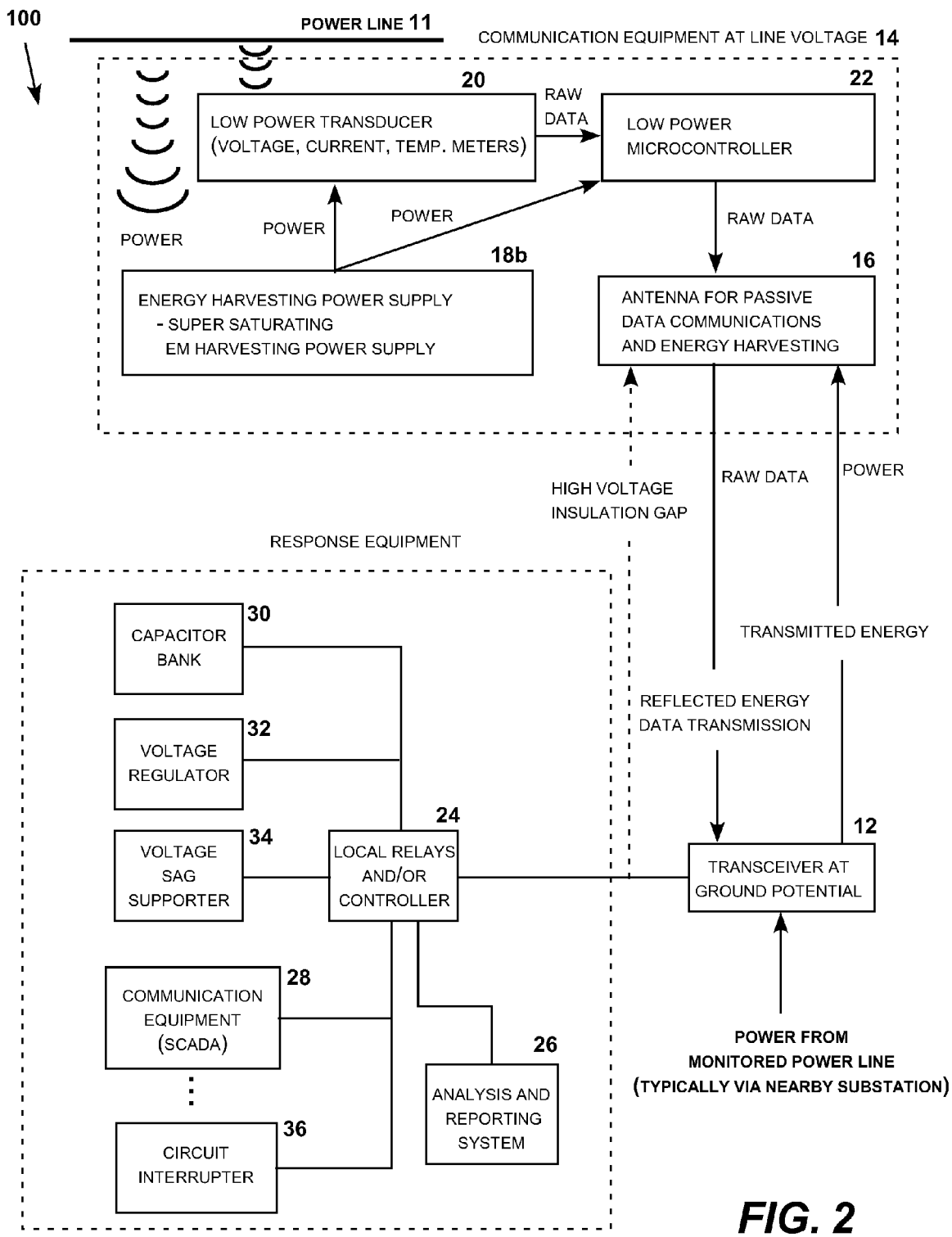
FIG. 2 is a functional block diagram of a high voltage power line communication and control system using a power harvesting power supply maintained at line voltage that includes a super-saturating magnetic flux core that harvests energy from the electromagnetic field emitted by the power line.

FIG. 2 is a functional block diagram for the communication and control system 100 that may be identical to the system 10 shown in FIG. 1 except that the power harvesting power supply 18b is an electromagnetic field harvesting power supply that includes a super-saturating magnetic flux core instead of the power supply 18a in the system 10 that scavenges power from the transceiver 12 maintained at ground level. The super-saturating magnetic flux core of the power supply 18b fully saturates at a very low current level in the power line. This causes the power supply 18b to produce a sufficient and stable amount of power even though the power line current may vary significantly. The material used for the super-saturating magnetic flux core is often referred to as "mu-metal" because the Greek letter "mu" ($\mu$) is traditionally used to designate the magnetic flux permeability of the material, which is extraordinarily high in the super-saturating magnetic flux core. A typical mu-metal is a nickel-iron alloy (approximately 75% nickel, 15% iron, plus copper and molybdenum) exhibiting a very high magnetic permeability. Mu-metal can have relative permeabilities of 80,000-100,000 Henry-per-meter compared to several thousand for ordinary steel.

The technical difficulty when attempting to harvest electric power to drive electronics is that attempting to use a conventional current transformer to generate the power has two disadvantages. First, it is difficult to get a conventional current transformer to provide energy at low continuous currents. This is because the power output varies nearly linearly with the line current, which often tends to be relatively high and vary throughout the day. Second, conventional current transformers provide more energy at typical load currents that is required to operate electronics, and also provide enormous amounts of undesired energy under faulted conditions. A power supply with a super-saturating magnetic flux core, on the other hand, fully saturates and therefore causes the output power to ramp up quickly to reach close to the maximum power output at a relatively low line current, and then levels out such that the power output remains stable for higher levels of line current. The technique of using a power supply with a core having extremely high magnetic flux permeability thus provides a sufficient and stable amount of harvested energy over the expected operating range of the power line even though the line current varies widely. The super-saturating energy harvesting power supply thereby minimizes the need to deal with excess harvested energy under normal load current and fault current conditions. Using a super-saturating magnetic flux core also has the benefit of providing a sufficient and stable amount of harvested power with a small cross-section core.

The use of a super-saturating magnetic flux core is generally thought to be undesirable in conventional transformer design, which generally leads the designer away from the solution provided by the present invention. In the power harvesting power supply, however, the super-saturating magnetic flux core provides unique and desirable features of providing a sufficient and stable of harvested energy even at low currents while minimizing excess energy and harmonics that would be provided by conventional solutions. Conventional current transformers would require several hundred amps of line current to be able to support the power needed to run the electronics and transmitters, and the current would increase approximately linearly with the line current, which may reach into the range of a thousand amps. A power supply with a super-saturating magnetic flux core, on the other hand, is capable of providing sufficient energy to operate the communication electronics at 10 to 20 amps of line current, while the power output can be readily conditioned through electronic circuitry to remain in the desired range as the line current increases to normal load and even fault levels. As a result, the communication and control system 100 operates continuously whenever the power line is energized because at least the minimal loading of 10 to 20 amps required to operate the communication electronics can be expected to flow whenever the power line is connected to the grid.

It should be understood that the foregoing relates only to the exemplary embodiments of the present invention, and that numerous changes may be made therein without departing from the spirit and scope of the invention as defined by the following claims.

The invention claimed is:

1. A communication and control system for a high voltage electric power line operating at a line voltage, comprising:
 a transceiver maintained at ground potential;
 communication equipment maintained at the line voltage comprising one or more low power transducers for obtaining measured parameters indicating operating conditions of the power line, a microcontroller for processing the measured parameters, an antenna for communicating the measured parameters via a beam of energy propagating through ambient atmosphere to the transceiver maintained at ground potential, and a battery-free energy harvesting power supply maintained at the line voltage providing electric power to electronic components of the communication equipment maintained at the line voltage;
 response equipment coupled to the transceiver maintained at ground potential for implementing one or more response actions in response to the measured parameters; and
 wherein the energy harvesting power supply obtains power from an electromagnetic field in ambient atmosphere around the energy harvesting power supply.

2. The communication and control system of claim 1, wherein the energy harvesting power supply obtains scavenged power transmitted by the transceiver maintained at ground potential.

3. The communication and control system of claim 1, wherein the energy harvesting power supply obtains power from an electromagnetic field produced by the power line through a super-saturating magnetic flux core.

4. The communication and control system of claim 1, wherein the communication equipment maintained at the line voltage communicates the measured parameters to the transceiver maintained at ground potential by modulating a beam of energy transmitted by the transceiver maintained at ground potential and reflected back to the transceiver maintained at ground potential.

5. The communication and control system of claim 1, wherein the communication equipment maintained at the line voltage modulates the beam of energy transmitted by the transceiver maintained at ground potential by switching an element that changes an impedance characteristic of the antenna.

6. The communication and control system of claim 1, wherein the response equipment includes power control equipment selected from the group consisting of a capacitor bank, a voltage regulator, a voltage sag supporter, and a circuit interrupter.

7. The communication and control system of claim 1, wherein:
 the communication equipment maintained at the line voltage communicates the measured parameters to the transceiver maintained at ground potential in a raw data format comprising data points obtained from each sensor at least every 4 milliseconds that has not been error corrected, integrated or summarized; and
 the transceiver maintained at ground potential or a processor operatively connected to the transceiver maintained at ground potential error corrects, integrates and summarizes the measured parameters to reconstruct one or more wave forms represented by the measured parameters.

8. The communication and control system of claim 1, wherein the response equipment includes communication equipment for transmitting the measured parameters to a remote location that enters the measured parameters into a reporting and analysis system.

9. The communication and control system of claim 1, wherein the response equipment includes communication equipment for transmitting the measured parameters to a remote location that remotely control power control equipment affecting the operation of the power line.

10. The communication and control system of claim 9, wherein the power control equipment includes a capacitor bank, a voltage regulator, a voltage sag supporter, or a circuit interrupter.

11. The communication and control system of claim 1, wherein the transceiver maintained at ground potential receives electric power via a local transformer or substation interconnected with the power line.

12. A communication and control system for a high voltage electric power line operating at a line voltage, comprising:
 a transceiver maintained at ground potential;
 communication equipment maintained at the line voltage comprising one or more low power transducers for obtaining measured parameters indicating operating conditions of the power line, a microcontroller for processing the measured parameters, an antenna for communicating the measured parameters via a beam of energy propagating through ambient atmosphere to the transceiver maintained at ground potential, and a battery-free energy harvesting power supply maintained at the line voltage providing electric power to electronic components of the communication equipment maintained at the line voltage;
 wherein the energy harvesting power supply obtains power from an electromagnetic field produced by the power line through a super-saturating magnetic flux core.

13. The communication and control system of claim 12, wherein the communication equipment maintained at the line voltage communicates the measured parameters to the transceiver maintained at ground potential by modulating a beam of energy transmitted by the transceiver maintained at ground potential and reflected back to the transceiver maintained at ground potential.

14. The communication and control system of claim 12, wherein the communication equipment maintained at the line voltage modulates the beam of energy transmitted by the transceiver maintained at ground potential by switching an element that changes an impedance characteristic of the antenna.

15. The communication and control system of claim 12, wherein the response equipment includes power control equipment selected from the group consisting of a capacitor bank, a voltage regulator, a voltage sag supporter, and a circuit interrupter.

16. The communication and control system of claim 15, wherein:
- the communication equipment maintained at the line voltage communicates the measured parameters to the transceiver maintained at ground potential in a raw data format comprising data points obtained from each sensor at least every 4 milliseconds that has not been error corrected, integrated or summarized; and
- the transceiver maintained at ground potential or a processor operatively connected to the transceiver maintained at ground potential error corrects, integrates and summarizes the measured parameters to reconstruct one or more wave forms represented by the measured parameters.

17. The communication and control system of claim 12, wherein the response equipment includes communication equipment for transmitting the measured parameters to a remote location that enters the measured parameters into a reporting and analysis system.

18. The communication and control system of claim 12, wherein the response equipment includes communication equipment for transmitting the measured parameters to a remote location that remotely control power control equipment affecting the operation of the power line.

19. The communication and control system of claim 18, wherein the power control equipment includes a capacitor bank, a voltage regulator, a voltage sag supporter, or a circuit interrupter.

20. The communication and control system of claim 12, wherein the transceiver maintained at ground potential receives electric power via a local transformer or substation interconnected with the power line.

* * * * *